(12) United States Patent
Springer et al.

(10) Patent No.: US 10,326,179 B2
(45) Date of Patent: Jun. 18, 2019

(54) METHOD AND DEVICE FOR MONITORING A STATE OF AT LEAST ONE PREDETERMINED BATTERY CELL OF A BATTERY

(71) Applicants: Robert Bosch GmbH, Stuttgart (DE); Lithium Energy and Power GmbH & Co. KG, Stuttgart (DE)

(72) Inventors: Bernhard Springer, Denkingen (DE); Marco Friedrich, Ludwigsburg (DE)

(73) Assignees: Robert Bosch GmbH, Stuttgart (DE); Lithium Energy and Power GmbH & Co. KG, Stuttgart (DE)

( * ) Notice: Subject to any disclaimer, the term of this patent is extended or adjusted under 35 U.S.C. 154(b) by 354 days.

(21) Appl. No.: 15/209,475

(22) Filed: Jul. 13, 2016

(65) Prior Publication Data

US 2017/0018821 A1   Jan. 19, 2017

(30) Foreign Application Priority Data

Jul. 14, 2015 (EP) .................................... 15176640

(51) Int. Cl.
*G01R 31/396* (2019.01)
*H01M 10/48* (2006.01)
(Continued)

(52) U.S. Cl.
CPC .......... *H01M 10/482* (2013.01); *B60L 58/10* (2019.02); *B60L 58/22* (2019.02); *G01R 31/367* (2019.01);
(Continued)

(58) Field of Classification Search
CPC .......... H01M 10/482; H01M 10/4285; H01M 10/44; H01M 2220/20; B60L 11/1851;
(Continued)

(56) References Cited

U.S. PATENT DOCUMENTS

| 2013/0018606 A1 | 1/2013 | White et al. |
| 2014/0077764 A1 | 3/2014 | Brun-Buisson et al. |
| 2015/0037624 A1* | 2/2015 | Thompson .......... H01M 10/425 429/50 |

FOREIGN PATENT DOCUMENTS

| DE | 102013217752 | 3/2015 |
| WO | 2015001703 | 1/2015 |

* cited by examiner

*Primary Examiner* — Melissa J Koval
*Assistant Examiner* — Courtney G McDonnough
(74) *Attorney, Agent, or Firm* — Michael Best & Friedrich LLP

(57) ABSTRACT

A method for monitoring a state of at least one predetermined battery cell of a battery having a number of series-connected or series-connectable battery cells. In one example, the method includes placing the battery, during a first phase, into a first state in which the battery cells in each case have a predefined charging state, discharging the battery, which is in the first state, during a second phase following the first phase, charging the battery during a third phase, following the second phase, up to a point in time at which at least one battery cell of the battery has the predefined charging state, detecting the voltage provided by the at least one predetermined battery cell at least temporarily, and determining information for detecting the state of the at least one predetermined battery cell by evaluating the detected voltage.

8 Claims, 1 Drawing Sheet

(51) Int. Cl.
*G01R 31/3835* (2019.01)
*H02J 7/00* (2006.01)
*G01R 31/367* (2019.01)
*B60L 58/10* (2019.01)
*B60L 58/22* (2019.01)
*H01M 10/44* (2006.01)
*H01M 10/42* (2006.01)

(52) U.S. Cl.
CPC ....... *G01R 31/3835* (2019.01); *G01R 31/396* (2019.01); *H02J 7/0014* (2013.01); *H02J 7/0021* (2013.01); *H01M 10/4285* (2013.01); *H01M 10/44* (2013.01); *H01M 2220/20* (2013.01); *Y02T 10/7005* (2013.01); *Y02T 10/7061* (2013.01)

(58) Field of Classification Search
CPC .............. B60L 11/1866; G01R 31/362; G01R 31/3658; H02J 7/0014; H02J 7/0021
USPC ........................................................ 342/434
See application file for complete search history.

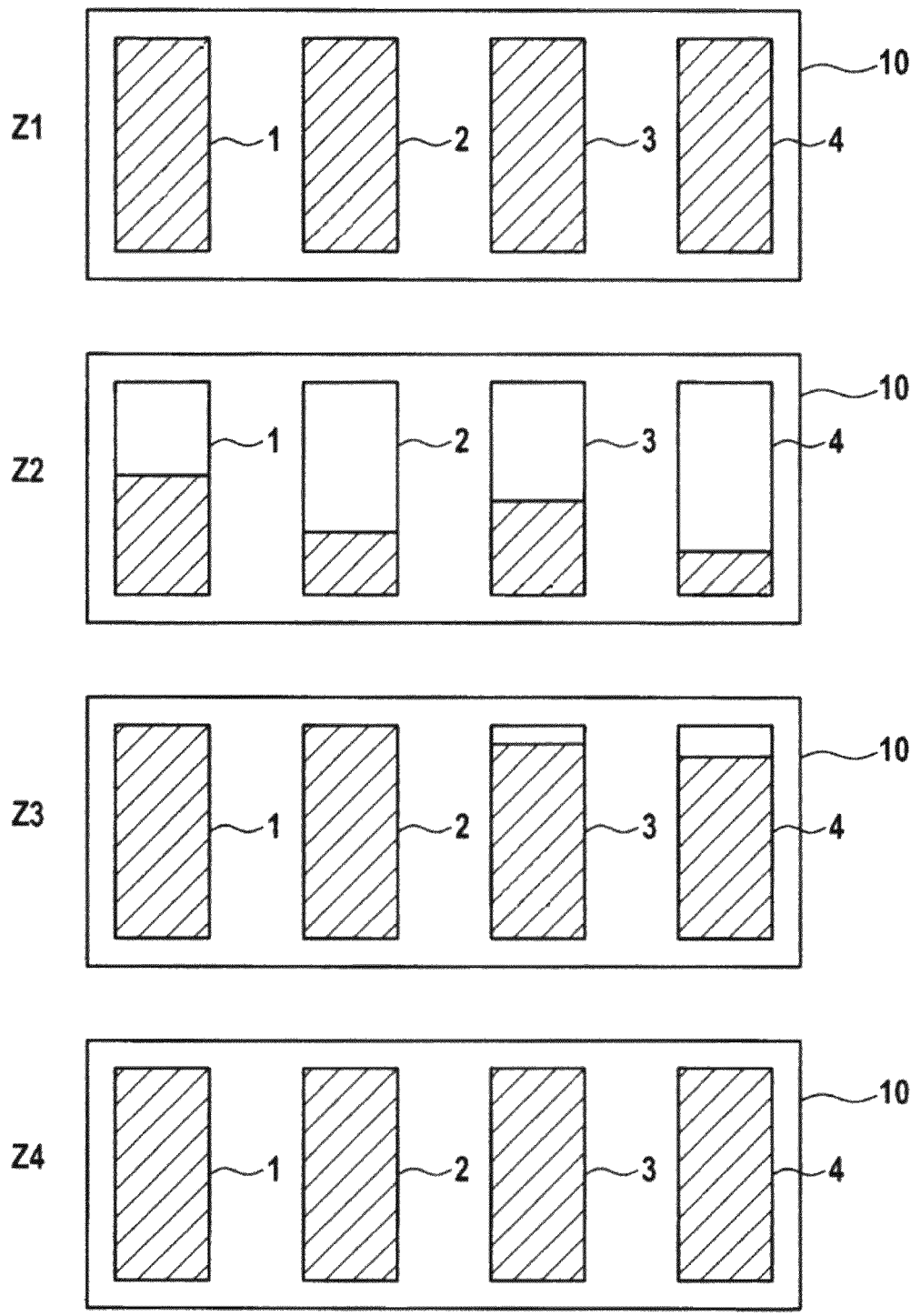

METHOD AND DEVICE FOR MONITORING A STATE OF AT LEAST ONE PREDETERMINED BATTERY CELL OF A BATTERY

BACKGROUND OF THE INVENTION

The present invention relates to a method and a corresponding device for monitoring a state of at least one battery cell of a battery having a number of series-connected or series-connectable battery cells.

In battery cells, faults may occur. These faults can be, for example, local short circuits which are caused, for example, by dendrites and/or contamination in the battery cells, aging of the battery cells, production faults or mechanical effects. Such short circuits can lead to a production of self-discharging currents in the battery cells. In consequence, these faults represent a safety risk in a charged state of a battery having such battery cells since local heating of the battery cells may occur.

Current battery systems which are typically used for electromobility applications comprise batteries having a number of series-connected or connectable battery cells through which one and the same current flows during charging and/or discharging of the battery. The electrical energy and power which can be taken from such a battery system is determined by the battery cell which has a minimum capacity and a maximum internal impedance of all battery cells. It is advantageous, therefore, that in such a battery system, battery cells are installed which have similar capacities and internal impedances, if possible. It is known that aging of a battery cell typically reduces its capacity and typically increases its internal impedance. Due to aging and self discharging currents flowing in the battery cells of an aforementioned battery system, the battery cells discharge at different rates. In the long term, this leads to different charging states of the battery cells. It is necessary, therefore, to perform a charging state compensation between the charging state of the battery cells of such a battery system regularly. This process is usually called balancing.

From document CN 10231546 B, a battery having a number of battery cells is known. In this context, a state of the battery is monitored by a battery management system. The battery management system is designed to initiate and activate a performance of a charging state compensation between different charging states of the battery cells of the battery.

From document US 2013/0018606, a battery having a number of battery cells is known. In this context, a number of charging state compensations are performed between different charging states of the battery cells of the battery. Furthermore, a frequency is determined for each battery cell with which an energy stored in the respective battery cell is varied during the number of charging state compensations. Using an evaluation of the frequency determined for each battery cell, it is determined whether the respective battery cell is in a faulty state. Such a faulty state can occur in consequence of an internal short circuit of the respective battery cell.

SUMMARY OF THE INVENTION

According to the invention, a method for monitoring a state of at least one predetermined battery cell of a battery having a number of series-connected or series-connectable battery cells is provided. The method according to the invention comprises a first, a second, a third, a fourth and a fifth step. The first step comprises placing the battery into a first state in which the battery cells in each case have a predefined charging state, during a first phase. The second step comprises discharging the battery, which is in the first state, during a second phase following the first phase. The third step comprises charging the battery during a third phase, following the second phase, up to a point in time at which at least one battery cell of the battery has the predefined charging state. The fourth step comprises detecting the voltage provided by the at least one predetermined battery cell at least after ending the discharging occurring during the second phase and at least after ending the charging occurring in the third phase. The fifth step comprises determining information for detecting the state of the at least one predetermined battery cell by means of evaluating the detected voltage. The subclaims illustrate preferred developments of the invention.

In the method according to the invention, evaluation of the detected voltage comprises an evaluation of the voltage detected at least after ending the discharging occurring during the second phase and an evaluation of the voltage detected at least after ending the charging occurring during the third phase.

In the method according to the invention, it is to be taken into consideration that the charging state of a battery cell can have values which can be between 0% and 100% or between 0 and 1. In this context, a battery cell having a charging state which has a value of 0% or 0 is understood to be a battery cell which is completely discharged. Furthermore, a battery cell having a charging state which has a value of 100% or 1 is understood to be a battery cell which is completely charged.

In the method according to the invention, the predefined charging state can have, for example, a value of 50% or of 80% or of 100%.

In a method described before, the at least one predetermined battery cell preferably comprises all battery cells of the battery.

In a method described before, after the first phase has ended and before the second phase has begun, a plurality of discharging and charging processes can occur successively. In this way, during at least one charging process, a charging of the battery can take place, by means of which the at least one battery cell of the battery is brought to the predefined state of charging as during the third phase. In consequence, the second phase and the third phase can occur several times repeatedly in succession after the ending of the first phase in a method described before. Furthermore, a predefined pause phase can be provided between at least one discharge process and a charging process following it. As well, a partial discharge of the battery can take place during a discharging process or during a charging occurring during a second phase, respectively. If the battery is used in a vehicle, such partial discharging and such partial charging of the battery can be carried out during a utilization of the vehicle. Such partial discharging and such partial charging of the battery are harmless for the applicability of a method described before. It must be taken into consideration here that determining of the information for detecting the state of the at least one predetermined battery cell or detecting the state of the at least one predetermined battery cell can always be carried out immediately after ending a charging in which the at least one battery cell of the battery is brought to the predefined charging state.

In a method described before, a first analyzing step is performed preferably for detecting the state of the at least one predetermined battery cell and a second analyzing step for detecting the state of the at least one predetermined battery cell. The first analyzing step preferably comprises the detecting of the voltage provided by the at least one predetermined battery cell at least after ending the discharging occurring during the second phase and evaluating the voltage detected at least after ending of the discharging occurring during the second phase. Preferably, the second analyzing step comprises the detecting of the voltage provided by the at least one predetermined battery cell at least after ending the charging occurring in the third phase and evaluating the voltage detected at least after ending the charging occurring during the third phase. Preferably, the first analyzing step is performed after ending the second phase and/or the second analyzing step is performed after ending the third phase.

In a method described before, a point in time at which the discharging performed during the second phase is ended can preferably correspond to a further point in time at which an individual one or a number of the battery cells of the battery have reached a further predefined charging state, especially at the same time. At this further point in time, other battery cells of the battery in each case have a greater charging state compared with the further predefined charging state. The further predefined charging state can have, for example, a value of for example 10%. In a method described previously, the point in time at which the charging performed during the third phase is ended can preferably correspond to a point in time at which an individual one or a number of the battery cells of the battery have reached a predefined charging state, especially at the same time. At this point in time, other battery cells of the battery have in each case a lesser charging state compared with the predefined charging state.

In a method described before, a sixth step is preferably performed. The sixth step comprises detecting each battery cell to be tested of the at least one predetermined battery cell which, immediately after ending the charging performed during the third phase has a lower charging state compared with the predefined charging state. During this process, detecting each battery cell to be tested of the at least one predetermined battery cell is detected during the evaluation of the voltage detected after the ending of the charging occurring during the third phase.

In a method described before, all battery cells of the battery are initially brought to the predefined charging state during the first stage. After the discharging performed during the second phase has ended, the battery cells of the battery provide different voltages and, in consequence, also have different charging states. During this process, both moderately functioning battery cells of the battery and potentially hazardous battery cells of the battery provide lower voltages than well-functioning battery cells of the battery. Battery cells which, as a result of production or aging have small capacities but no or very low self-discharging currents are designated as moderately functioning battery cells. Battery cells which have high self-discharging currents are designated as potentially hazardous battery cells. Battery cells which have high capacities and no or very low self-discharging currents are designated as well-functioning battery cells. In consequence, after the discharging performed during the second phase is ended, both the moderately functioning battery cells and the potentially hazardous battery cells of the battery have smaller charging states than the well-functioning battery cells of the battery. This can preferably be detected by the first analyzing step performed after ending the second phase. However, after the end of the second phase, it is not yet possible to distinguish between the moderately functioning battery cells and the potentially hazardous battery cells. If in a method described previously the second phase and the third phase occur several times repeatedly in succession, the first analyzing step can be performed preferably after the end of each second phase. In other words, the first analyzing step is performed preferably before beginning each third phase.

After the discharging performed during the third phase is ended, both the well-functioning battery cells and the moderately functioning battery cells exhibit the predefined charging state and the potentially hazardous battery cells have in each case a smaller charging state compared with the predefined charging state. The reason for this is that in each case one and the same quantity of charge is removed from all battery cells by the discharging performed during the second phase. In this context, a quantity of charge which is approximately equal to the first quantity of charge must be supplied to the battery cells of the battery which have no or very small self-discharging currents so that they have in each case the predefined charging state. In a method described previously, this fact can be utilized by a choice of the time at which the charging performed in the third phase is ended. Thus, this time is preferably selected in such a manner that all battery cells of the battery are supplied by the charging performed during the third phase with a quantity of charge which is approximately equal to the first quantity of charge. This means that after the charging performed during the third phase has ended, the potentially hazardous battery cells cannot have the predefined charging state in each case. The reason for this is that the potentially hazardous battery cells would have to be supplied with a charging quantity during the third phase which is distinctly higher than the first charging quantity so that they have in each case the predefined charging state. By this means, charge losses can be compensated for which would arise in consequence of the high self-discharging currents of the potentially hazardous battery cells. This means that at the aforementioned time, only the potentially hazardous battery cells have in each case a smaller charging state compared with the predefined charging state. In other words, in a method described before, each potentially hazardous battery cell of the battery can be identified preferably by the second analyzing step and classified as a battery cell to be checked.

In a method described before, a seventh step is preferably performed. The seventh step comprises detecting each further battery cell to be tested of the at least one predetermined battery cell which, immediately after ending the discharging performed during the second phase, has a charging state which is below a charging state threshold value and is not a battery cell to be tested. In this context, the detection of each further battery cell to be checked of the at least one predetermined battery cell is done by means of evaluation of the detected voltage. In other words, each battery cell of the at least one predetermined battery cell which, immediately after the end of the discharging performed during the second phase, has a charging state which is below a charging state threshold value and has not been classified as a potentially hazardous battery cell by the second analyzing step, can be detected preferably as a moderately functioning battery cell. Each moderately functioning battery cell thus detected can be a battery cell, the capacity of which is low due to excessively high aging.

After the discharging performed during the second phase is ended, the well-functioning battery cells of the battery have larger charging states than the moderately functioning ones and than the potentially hazardous battery cells of the battery. In a method previously described which comprises the seventh step, this fact can be preferably utilized by a suitable choice of the charging state threshold value. Since all potentially hazardous battery cells of the battery are detectable in accordance with the sixth step, all moderately functioning battery cells of the battery can also be detected very early in accordance with the seventh step. In other words, each moderately functional battery cell of the battery can be identified preferably by the first analyzing step and the second analyzing step and classified as a further battery cell to be checked in a method previously described which comprises the seventh step.

In a method described previously it is advantageous that each potentially hazardous battery cell and/or each moderately functioning battery cell of the battery can be detected very rapidly. As a result, relevant safety measures can be initiated very early.

It is also advantageous in a method described previously that for the detection of each potentially hazardous battery cell and/or each moderately functioning battery cell, no further technical means such as, for example, hardware, are required additionally to measuring devices which normally are already present in current battery systems with a battery as described before. The aforementioned detection only requires an additional software function.

In a method described before, an eighth and a ninth step are preferably performed. The eighth step comprises detecting the current flowing through the battery at least during the discharging which occurs during the second phase and at least during the charging which occurs during the third phase. The ninth step comprises determining a capacity and/or a self-discharging current of the at least one predetermined battery cell by means of an evaluation of the detected voltage and of the detected current.

In a method described before, a tenth step is preferably performed. The tenth step comprises performing at least one charging state compensation between charging states of the battery cells after ending the third phase.

It can be provided that the at least one charging state compensation is in each case a passive charging state compensation. With each passive charging state compensation, each battery cell of the battery which has in each case a charging state which is greater than a minimum charging state of the battery cells of the battery is in each case brought to the minimum charging state via a control discharge. In this context, each control discharging occurs in each case via an impedance having preferably a low impedance tolerance, which is allocated to the respective battery cell. In this context, the respective quantity of electrical energy is removed from each battery cell to be discharged via the impedance allocated, and converted into heat.

In a method described before, an eleventh and a twelfth and/or a thirteenth step are preferably performed. The eleventh step comprises detecting further information about a behavior of the at least one predetermined battery cell of the battery during the performance of the at least one charging state compensation.

It can be provided that the further information detected about the at least one predetermined battery cell exhibits first information which comprises each frequency with which an energy stored in a predetermined battery cell is changed during the at least one charging state compensation.

It may be provided that the detected further information about the at least one predetermined battery cell exhibits second information which comprises each voltage which is provided by a predetermined battery cell during the at least one charging state compensation.

It may also be provided that the detected information on the at least one predetermined battery cell comprises third information which comprises each quantity of energy or charge which is supplied to or removed from a predetermined battery cell during the at least one charging state compensation.

In a case in which the at least one charging state compensation is in each case a passive charging state compensation, the third information comprises each quantity of energy or charge which is removed from a predetermined battery cell during the at least one charging state compensation. In this context, each removed quantity of energy or charge is preferably determined by means of an integration, performed over a corresponding period, of a kind which flows through the impedance which is allocated a respective predetermined battery cell during the at least one charging state compensation. In this case, the third information preferably also comprises each current which flows to the at least one charging state compensation through an impedance which is allocated to a predetermined battery cell.

The twelfth step comprises detecting each battery cell to be tested, also designated as a potentially hazardous battery cell, and/or each further battery cell to be tested, also to be designated as moderately functioning battery cell, by means of evaluating the detected further information about the at least one predetermined battery cell, particularly by means of an evaluation of the first information. For example, each predetermined battery cell, the charging state of which is reduced very rarely in comparison with other predetermined battery cells, is preferably detected as a potentially hazardous battery cell and classified as a battery cell to be checked, in the case in which the at least one charging state compensation is in each case a passive charging state compensation.

The thirteenth step comprises determining the capacity and/or the self-discharging current of the at least one predetermined battery cell by means of the detected further information about the at least one predetermined battery cell, particularly by means of the second and/or the third information.

In the case of a method described before which comprises the eleventh step, determining of the capacity and/or of the self-discharging current of the at least one predetermined battery cell is preferably carried out by means of an evaluation of the voltage provided by it and detected, of the detected current and of the detected further information about the at least one predetermined battery cell.

In a method described before, a fourteenth and/or a fifteenth step is performed. The fourteenth step comprises detecting each battery cell, the self-discharging current of which is determined, in each case as battery cell which is in a critical state when the self-discharging current of the latter cell exceeds a current threshold value. A battery cell which is in a critical state will also be called a hazardous battery cell in the text which follows. The fifteenth step comprises detecting each battery cell, the capacity of which is determined, in each case as a battery cell which is in an unwanted state when the capacity of the latter cell is in each case below a capacity threshold value. A battery cell which is in an unwanted state will also be called a battery cell aged by an above-average amount in the text which follows. In this way, each hazardous battery cell and/or each battery cell aged by an above-average amount of the battery can be detected. In this context, the battery can be a part of a battery system currently produced in series with a permanent interconnection of the battery cells of the battery in which further operation of the battery cells detected as described before can be prevented by switching off of the battery. Furthermore, the battery can be part of a novel battery system in which adding and/or bypassing a single battery cell or of a single battery cell module of the battery is possible with the aid of an electronic circuit. Further operation of such a novel battery system can take place with a reduced number of well-functioning battery cells of the battery but without involvement of hazardous battery cells of the battery and/or also without a restriction due to battery cells aged by an above-average amount of the battery. Dealing with a fault of each hazardous battery cell and/or of each battery cell aged by an above-average amount can be handled, for example, by exchanging the respective battery cell or a battery cell module having the respective battery cell and/or by transferring the respective battery cell or the respective battery module into a safe state. In this context, transferring into the safe state can take place by discharging and/or preventing a recharging of the respective battery cell or of the respective battery module.

In a method described before, each battery cell, the self-discharging current of which is determined is preferably first detected as a battery cell to be checked. In a method described before, each battery cell, the capacity of which is determined, is preferably first detected as a further battery cell to be tested. In this manner, a determination of the self-discharging current and/or of the capacity is performed only for a reduced number of battery cells for each hazardous battery cell and/or each battery cell aged by an above-average amount can be recognized very rapidly.

A further aspect of the invention relates to a device for monitoring a state of at least one predetermined battery cell of a group of battery cells which consists of at least one battery cell of a battery which has a number of series-connected or series-connectable battery cells. In this context, this device is designed to detect a presence of a first phase during which the battery is placed into a first state in which the battery cells of the battery have in each case a predefined charging state. Furthermore, the device is designed to detect a presence of a second phase following the first phase, during which discharging of the battery, which is in the first stage, takes place. The device is also designed to detect a presence of a third phase following the second phase during which charging of the battery occurs up to a point in time at which at least one battery cell of the battery has the predefined charging state. Furthermore, the device is designed to determine information about the state of the at least one predetermined battery cell of the group of battery cells in accordance with a method described before.

The device is also preferably designed to detect a performance of at least one charging state compensation between charging states of the battery cells.

A device described before is preferably designed to perform a method described before.

It may be provided that the group of battery cells comprises all battery cells of the battery. In this case, a device described before can preferably be a central controller for the battery described before. As an alternative, it may be provided that the battery comprises a number of battery modules which have in each case at least one battery cell of the battery, and that the group of battery cells consists of the at least one battery cell of a battery cell module of the battery. A device described can here be preferably a central controller for the battery cell module with the at least one battery cell of the group of battery cells.

BRIEF DESCRIPTION OF THE DRAWING

In the text which follows, an illustrative embodiment of the invention is described in detail with reference to the accompanying drawing. In each case, identical reference symbols are used for identical components and parameters. In the drawing:

FIG. 1 is a diagrammatic representation of a number of states of one and the same battery of a vehicle.

DETAILED DESCRIPTION

FIG. 1 shows a first state Z1, a second state Z2, a third state Z3 and a fourth state Z4 of one and the same battery 10 of a vehicle. The battery 10 comprises a first battery cell 1, a second battery cell 2, a third battery cell 3 and a fourth battery cell 4. The four battery cells 1, 2, 3, 4 are connected in series.

In the text which follows, each charging state which has a battery cell i of the four battery cells 1, 2, 3, 4 of the battery 10 which is in a state Zj of the four states Z1, Z2, Z3, Z4, is designated by $L_{ji}$. It must be taken into consideration here that a charging state of a battery cell can be between 0% and 100% or between 0 and 1, respectively, the charging state being 0% or 0, respectively, if the respective battery cell is completely discharged and being 100% or 1, respectively, if the respective battery cell is completely charged. In the text which follows, each quantity of charge which is stored in a battery cell i of the four battery cells 1, 2, 3, 4 of the battery 10, which is in a state Zj of the four states Z1, Z2, Z3, Z4, is designated by $Q_{ji}$, where j is a natural number which has a value of 1 for a first state Z1, a value of 2 for the second state Z2, a value of 3 for the third state Z3 and a value of 4 for the fourth state Z4. Furthermore, i is a natural number which has a value of 1 for the first battery cell 1, a value of 2 for the second battery cell 2, a value of 3 for the third battery cell 3 and a value of 4 for the fourth battery cell 4. In FIG. 1, a magnitude of the charging state $L_{ji}$ of a battery cell i of the four battery cells 1, 2, 3, 4 is symbolized by a ratio between a shaded area of the respective battery cell i and a total area of the latter for the battery 10 which is in a state Zj of the four states Z1, Z2, Z3, Z4.

A detection, to be performed in accordance with a first embodiment of the invention, of each battery cell 3, 4 of the battery 10 which has a high self-discharging current, will be described in greater detail in conjunction with FIG. 1. In the text which follows, the third and the fourth battery cell 3, 4 of the battery 10 which have in each case a high self-discharging current is also designated as potentially hazardous battery cells 3, 4.

According to the first embodiment, the battery 10 is placed to a first phase into the first state Z1 in which the four battery cells 1, 2, 3, 4 in each case have a predefined charging state of, for example, 100%. This means that each battery cell 1, 2, 3, 4 of the battery 10 which is in the first state Z1 has a charging state L11, L12, L13, L14 which is equal to the predefined charging state. This is achieved in that the vehicle is initially connected to a charging device until at least one battery cell 1, 2 of the battery 10 has the predefined charging state. Immediately thereafter, a charging state compensation is performed between the charging states of the four battery cells 1, 2, 3, 4. Subsequently, the battery 10 is recharged until all four battery cells 1, 2, 3, 4 have the predefined charging state. This is achieved by connecting the vehicle again to the charging device. The predefined charging state can also have other values which are in each case greater than 0% and less than 100%. In this case, a value of 100% is selected only by way of example for the predefined charging state.

In the text which follows, each quantity of charge $Q_{1i}$ which is stored in a battery cell i of the four battery cells 1, 2, 3, 4 of the battery 10, which is in the first state Z1, is also designated as capacity Q1i of the respective battery cell i.

According to the first embodiment, a discharging of the battery 10 is performed during a second phase immediately following the first phase. This is achieved in that the vehicle is driven temporarily over a total period of the second phase. For example, the second phase extends over two days. During the second phase, the battery 10 is only discharged but not charged. In this process, the battery 10 is at an end of the second phase in the second state Z2 in which at least one battery cell 4 of the battery 10 has a further predefined charging state of, for example, 10%. The further predefined charging state can also have other values which are in each case greater than 0% and less than the predefined charging state. According to the first embodiment, each voltage which is provided by a battery cell i of the four battery cells 1, 2, 3, 4 of the battery 10 which is in the second state Z2 is detected. From these detected voltages, the charging states L21, L22, L23, L24 of the four battery cells 1, 2, 3, 4 of the battery 10 which is in the second state Z2 are determined in each case and compared with one another. Furthermore, a discharging current I2(t) which flows through the battery 10 during the second phase is detected in dependence on time t. In the text which follows, the second battery cell 2 of the battery 10 which, due to production or aging has in each case a low capacity Q12 but no or only a very small self-discharging current is also designated as moderately functioning battery cell 2. In the text which follows, the first battery cell 1 of the battery 10 which has in each case a high capacity Q11 and no or only very small self-discharging current is also designated as well-functioning battery cell 1. At the end of the second phase, both the moderately functioning battery cell 2 of the battery 10 and the potentially hazardous battery cells 3, 4 of the battery 10 will be discharged more than the well-functioning battery cell 1 of the battery 10. FIG. 1 shows that the second battery cell 2, the third battery cell 3 and the fourth battery cell 4 are in each case discharged more than the first battery cell 1. At the end of the second phase, it can thus only be found that the first battery cell 1 has a better state of health than any other battery cell 2, 3, 4 of the battery 10.

According to the first embodiment, charging of the battery 10 is performed during a third phase immediately following the second phase, up to an earliest point in time at which one or more of the battery cells 1, 2, 3, 4 of the battery 10 have reached the predefined charging state at the same time. At an end of the third phase, the battery 10 is in the third state Z3. According to the first embodiment, each voltage which is provided by a battery cell i of the four battery cells 1, 2, 3, 4 of the battery 10 which is in the third state Z3 is detected. From these detected voltages, the charging states L31, L32, L33, L34 of the four battery cells 1, 2, 3, 4 of the battery 10, which is the third state Z3, are determined in each case and compared with one another. Furthermore, a charging current I3(t), which flows through the battery 10 during the third phase is detected in dependence on time t. At the end of the third phase, it is possible to distinguish the potentially hazardous battery cells 3, 4 of battery 10 from the other battery cells 1, 2 of battery 10. The reason for this is that at the end of the third phase, both the well-functioning battery cell 1 of battery 10 and the moderately functioning battery cell 2 of battery 10 are charged completely independent of a magnitude of their capacity Q11, Q12 whereas the potentially hazardous battery cells 3, 4 of the battery 10 are not completely charged. From FIG. 1, it can be seen that at the end of the third phase, the first battery cell 1 and the second battery cell 2 are completely charged and the third battery cell 3 and the fourth battery cell 4 are not completely charged. In consequence, it can be seen from FIG. 1 that the third battery cell 3 and the fourth battery cell 4 are potentially hazardous battery cells. In consequence, FIG. 1 also shows that the first battery cell 1 and the second battery cell 2 have in each case no or only very low self-discharging current.

According to the first embodiment, a fourth phase immediately follows the third phase. In this context, at least one charging state compensation is performed between the charging states L31, L32, L33, L34 of the four battery cells 1, 2, 3, 4 immediately after ending the third phase. Following this, the battery 10 is recharged until all four battery cells 1, 2, 3, 4 are completely charged. At an end of the fourth phase, the battery 10 is in the fourth state Z4 in which the four battery cells 1, 2, 3, 4 are completely charged.

According to the first embodiment, a first charging quantity Q1 is determined which is taken from each battery cell 1, 2, 3, 4 by the discharging performed during the second phase. In this context, the first charging quantity Q1 is determined by an integration of the discharging current I2(t), occurring during the second phase, over a period tE located in the second phase during which the discharging current I2(t) flows through the battery 10.

According to the first embodiment, a second charging quantity Q2 is also determined which is supplied to each battery cell 1, 2, 3, 4 by the charging performed during the third phase. In this process, the second charging quantity Q2 is determined by an integration of the charging current I3(t), occurring during the third phase, over a second period tL, located in the third phase, during which the charging current I3(t) flows through the battery 10.

According to the first embodiment, each self-discharging current SIi of a battery cell i of the four battery cells 1, 2, 3, 4 is also determined by means of quantities determined during the second and third phase. Each self-discharging current SIi of a battery cell i of the four battery cells 1, 2, 3, 4 is then determined in accordance with relation (1).

$$SIi = \frac{-\frac{Q1}{1-L2i} + \frac{Q2}{L3i} + \frac{L2i \cdot Q1}{L3i \cdot (1-L2i)}}{\frac{tE+tP1}{1-L2i} + \frac{tL+tP2}{L3i} - \frac{(tE+tP1) \cdot L2i}{(1-L2i) \cdot L3i}} \quad (1)$$

In relation (1), a period of time located in the second phase, during which the discharging current I2(t) does not flow through the battery 10, is designated by tP1. A period of time located in the third phase during which the charging current I3(t) does not flow through the battery 10, is also designated by tP2 in relation (1).

According to the first embodiment, each capacity Q1i of a battery cell i of the four cells 1, 2, 3, 4 is also determined by means of the quantities determined during the second phase and the self-discharging current SIi determined for the respective battery cell i. The capacity Q1i of a battery cell i of the four battery cells 1, 2, 3, 4 is then determined in accordance with relation (2).

$$Q1i = \frac{Q1 + SIi \cdot tE + SIi \cdot tP1}{1-L2i} \quad (2)$$

In relations (1) and (2), each charging state Lji exhibited by a battery cell i of the four battery cells 1, 2, 3, 4 of the battery 10 which is in a state Zj of the four states Z1, Z2, Z3, Z4 is assessed with values located between 0 and 1.

In the text which follows, an exemplary value is specified in each case for each charging quantity Qji which is stored in a battery cell i of the four battery cells 1, 2, 3, 4 of a battery 10 which is a state Zj of the four states Z1, Z2, Z3, Z4 and shown in FIG. 1. Other exemplary values are also conceivable.

For the battery 10 which is in the first state Z1, the charging quantity Q11 stored in the first battery cell 1 is 15 Ah, the charging quantity Q12 stored in the second battery cell 2 is 10 Ah, the charging quantity Q13 stored in the third battery cell 2 is 15 Ah and the charging quantity Q14 stored in the fourth battery cell 4 is 10 Ah.

For the battery 10 which is in the second state Z2, the charging quantity Q21 stored in the first battery cell 1 is 7.5 Ah, the charging quantity Q22 stored in the second battery cell 2 is 2.5 Ah, the charging quantity Q23 stored in the third battery cell 3 is 6 Ah and the charging quantity Q24 stored in the fourth battery cell 4 is 1 Ah.

For the battery which is in the third state Z3, the charging quantity Q31 stored in the first battery cell 1 is 15 Ah, the charging quantity Q32 stored in the second battery cell 2 is 10 Ah, the charging quantity Q33 stored in the third battery cell 3 is 13.5 Ah and the charging quantity Q34 stored in the fourth battery cell 4 is 8.5 Ah.

For the battery 10 which is the fourth state Z4, the charging quantity Q41 stored in the first battery cell 1 is 15 Ah, the charging quantity Q42 stored in the second battery cell 2 is 10 Ah, the charging quantity Q43 stored in the third battery cell 3 is 15 Ah and the charging quantity Q44 stored in the fourth battery cell 4 is 10 Ah.

Apart from the preceding written disclosure, reference is made herewith additionally to the representation in FIG. 1 for the further disclosure of the invention.

The invention claimed is:

1. A method for monitoring a state of at least one predetermined battery cell of a battery having a number of series-connected or series-connectable battery cells, the method comprising:
    placing the battery into a first state in which the battery cells in each case have a predefined charging state, during a first phase,
    discharging the battery, which is in the first state, during a second phase following the first phase,
    charging the battery during a third phase, following the second phase, up to a point in time at which at least one battery cell of the battery has the predefined charging state,
    detecting the voltage provided by the at least one predefined battery cell at least after ending the discharging occurring during the second phase and at least after ending the charging occurring during the third phase, and determining information for detecting the state of the at least one predetermined battery cell by means of evaluating the detected voltage, and
    performing at least one charging state compensation between charging states of the battery cells after ending the third phase.

2. The method according to claim 1, further comprising:
    detecting each battery cell to be tested of the at least one predetermined battery cell which, immediately after ending the charging performed during the third phase has a lower charging state compared with the predefined charging state by means of an evaluation of the voltage detected after the ending of the charging occurring during the third phase.

3. The method according to claim 2, further comprising:
    detecting each further battery cell to be tested of the at least one predetermined battery cell which, immediately after ending the discharging performed during the second phase, has a charging state which is below a charging state threshold value and is not a battery cell to be tested, by means of evaluation of the detected voltage.

4. The method according to claim 1, further comprising:
    detecting the current flowing through the battery at least during the discharging which occurs during the second phase and at least during the charging which occurs during the third phase, and
    determining a capacity, a self-discharging current, or both of the at least one predetermined battery cell by means of an evaluation of the detected voltage and of the detected current.

5. The method according to claim 1, further comprising:
    detecting further information about a behavior of the at least one predetermined battery cell of the battery during the at least one charging state compensation and
    detecting each battery cell to be tested and/or each further battery cell to be tested of the at least one predetermined battery cell by means of evaluating the detected further information about the at least one predetermined battery cell and/or
    determining the capacity and/or the self-discharging current of the at least one predetermined battery cell by means of the detected further information about the at least one predetermined battery cell.

6. The method according to claim 4, further comprising:
    detecting each battery cell, the self-discharging current of which is determined, in each case as battery cell which is in a critical state when the self-discharging current of the latter exceeds a current threshold value,
    detecting each battery cell, the capacity of which is determined, in each case as a battery cell which is in an unwanted state when the capacity of the latter is in each case below a capacity threshold value, or
    both.

7. The method according to claim 4, wherein each battery cell, the self-discharging current of which is determined, has initially in each case been detected as a battery cell to be tested and/or each battery cell, the capacity of which is determined, initially was detected in each case as a further battery cell to be tested.

8. A device for monitoring a state of at least one predetermined battery cell of a group of battery cells which includes at least one battery cell of a battery which has a number of series-connected or series-connectable battery cells, wherein the device is designed to detect a presence of a first phase during which the battery is placed into a first state in which the battery cells of the battery have in each case a predefined charging state, a presence of a second phase following the first phase during which discharging of the battery, which is in the first state, takes place and a presence of a third phase following the second phase during which charging of the battery occurs up to a point in time at which at least one battery cell of the battery has the predefined charging state, and also to determine information about the state of the at least one predetermined battery cell of the group of battery cells by
    placing the battery into the first state,
    discharging the battery during the second phase,
    charging the battery during the third phase,
    detecting the voltage provided by at least one of the battery cells (1, 2, 3, 4) after ending the discharging and after ending the charging by means of evaluating a detected voltage, wherein the device is designed to detect a performance of at least one charging state compensation between charging states of the battery cells.

\* \* \* \* \*